US012738325B2

(12) United States Patent
Lemke et al.

(10) Patent No.: US 12,738,325 B2
(45) Date of Patent: Sep. 15, 2026

(54) SEQUENTIAL ERASE FOR TUNING THE PROGRAM STATE OF NON-VOLATILE MEMORY CELLS

(71) Applicant: Silicon Storage Technology, Inc., San Jose, CA (US)

(72) Inventors: Steven Lemke, Boulder Creek, CA (US); Gilles Festes, Fuveau (FR); Louisa Schneider, San Jose, CA (US); Yuri Tkachev, Sunnyvale, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 157 days.

(21) Appl. No.: 18/733,750

(22) Filed: Jun. 4, 2024

(65) Prior Publication Data

US 2025/0285684 A1 Sep. 11, 2025

Related U.S. Application Data

(60) Provisional application No. 63/563,304, filed on Mar. 8, 2024.

(51) Int. Cl.
*G11C 16/26* (2006.01)
*G11C 16/16* (2006.01)

(52) U.S. Cl.
CPC .............. *G11C 16/26* (2013.01); *G11C 16/16* (2013.01)

(58) Field of Classification Search
CPC ...................................................... G11C 16/26
(Continued)

(56) References Cited

U.S. PATENT DOCUMENTS 4,810,910 A 3/1989 Schoellikopf et al.
4,961,002 A 10/1990 Tam et al.
(Continued)

FOREIGN PATENT DOCUMENTS

CN 113450856 A 9/2021
EP 0566739 A1 10/1993
(Continued)

OTHER PUBLICATIONS

Jenn-Chyou Bor, et al., "Realization of the CMOS Pulsewidth-Modulation (PWM) Neural Network with On-Chip Learning," IEEE Transactions on Circuits and Systems, Jan. 1998.*
(Continued)

*Primary Examiner* — Muna A Techane
(74) *Attorney, Agent, or Firm* — DLA Piper LLP (US)

(57) ABSTRACT

A method and device for erasing a memory cell with a floating gate, by applying successive first erase pulses to the memory cell to remove electrons from the floating gate until a coarse target read current, and then applying successive second erase pulses to the memory cell to remove electrons from the floating gate until a target read current for the memory cell is achieved. The first erase pulses include a first parameter following a first progression that changes in value after respective ones of the first erase pulses. The first progression begins with a first value and ends with a second value. The second erase pulses include the first parameter following a second progression in which the first parameter changes in value after respective ones of the second erase pulses. The second progression begins with a third value that is between, and unequal to, the first and second values.

20 Claims, 12 Drawing Sheets

(58) Field of Classification Search
USPC .................................................. 365/189.011
See application file for complete search history.

(56) References Cited

U.S. PATENT DOCUMENTS 5,029,130 A 7/1991 Yeh
5,097,441 A 3/1992 Soo-In et al.
5,138,576 A 8/1992 Madurawe
5,146,602 A 9/1992 Holler
5,256,911 A 10/1993 Holler
5,264,734 A 11/1993 Holler
5,336,936 A 8/1994 Allen et al.
5,386,132 A 1/1995 Wong
5,469,397 A 11/1995 Hoshino
5,554,874 A 9/1996 Doluca
5,621,336 A 4/1997 Shibata et al.
5,643,814 A 7/1997 Chung
5,721,702 A 2/1998 Briner
5,914,894 A 6/1999 Diorio
6,219,281 B1 4/2001 Chen
6,222,777 B1 4/2001 Khieu
6,331,953 B1 * 12/2001 Wang ................. G11C 16/3445 365/185.29
6,683,645 B1 1/2004 Collins
6,747,310 B2 6/2004 Fan et al.
6,829,598 B2 12/2004 Milev
6,855,980 B2 2/2005 Wang
7,315,056 B2 1/2008 Klinger et al.
7,868,375 B2 1/2011 Liu et al.
10,269,440 B2 4/2019 Guo
10,388,389 B2 8/2019 Guo
10,699,779 B2 6/2020 Tran
10,720,217 B1 7/2020 Tran
10,748,630 B2 8/2020 Tran
10,803,943 B2 10/2020 Tran
11,023,559 B2 6/2021 McCollum
11,087,207 B2 8/2021 Tran
11,270,763 B2 3/2022 Tran
11,270,771 B2 3/2022 Tran
11,500,442 B2 11/2022 Tran
2002/0089014 A1 7/2002 Chern
2003/0034510 A1 2/2003 Liu
2003/0183871 A1 10/2003 Dugger
2004/0095809 A1 5/2004 Sakamoto
2004/0125655 A1 7/2004 Tsai
2004/0156241 A1 8/2004 Mokhlesi
2005/0087892 A1 4/2005 Hsu
2006/0104120 A1 5/2006 Hemink
2006/0170038 A1 8/2006 Wong
2007/0171756 A1 7/2007 Lambrache
2008/0310224 A1 * 12/2008 Roohparvar ........... G11C 16/10 365/185.03
2009/0073771 A1 * 3/2009 Li ....................... G11C 11/5628 365/185.22
2009/0103361 A1 4/2009 Wang
2009/0109760 A1 4/2009 Nazarian
2010/0046299 A1 2/2010 Roohparvar
2010/0290292 A1 11/2010 Tanizaki
2012/0087188 A1 4/2012 Hsieh et al.
2013/0044544 A1 2/2013 Shiino
2013/0100756 A1 4/2013 Liao et al.
2014/0054667 A1 2/2014 Tkachev
2014/0269062 A1 9/2014 Do
2014/0310220 A1 10/2014 Chang
2015/0106315 A1 4/2015 Birdwell
2015/0213898 A1 7/2015 Do
2015/0262055 A1 9/2015 Akopyan
2016/0042790 A1 2/2016 Tran
2016/0093382 A1 3/2016 Sakamoto
2016/0133639 A1 5/2016 Tran
2016/0180945 A1 6/2016 Ng
2016/0254269 A1 9/2016 Kim et al.
2017/0337466 A1 11/2017 Bayat
2017/0337971 A1 11/2017 Tran et al.
2017/0337980 A1 11/2017 Guo et al.
2018/0004708 A1 1/2018 Muralimanohar
2018/0268912 A1 9/2018 Guo et al.
2018/0293487 A1 10/2018 Copel
2019/0088325 A1 3/2019 Tiwari et al.
2019/0164617 A1 5/2019 Tran
2021/0142156 A1 * 5/2021 Tran ........................ G11C 11/54
2022/0215239 A1 * 7/2022 Tran ....................... G11C 16/10
2023/0128348 A1 4/2023 Li
2024/0071484 A1 * 2/2024 Bertuccio .............. G11C 16/32

FOREIGN PATENT DOCUMENTS

EP 0562737 B1 6/1998
JP H03-018985 A 1/1991
TW I 751441 B 1/2022

OTHER PUBLICATIONS

Alister Hamilton, et al., "Integrated Pulse Stream Neural Networks: Results, Issues, and Pointers," IEEE Transactions on Neural Networks, May 1992.*

Shafiee et al.,"Isaac: A Convolutional Neural Network Accelerator With In-Situ Analog Arithmetic in Crossbars;" 2016 ACM/IEEE 43rd Annual International Symposium on Computer Architecture, Seoul, Oct. 2016. [URL:https://www.cs.utah.edu/- rajeev/pubs/iscal.*

Shafiee et al,"Isaac: A Convolutional Neural Network Accelerator With In-Situ Analog Arithmetic in Crossbars;" 2016 ACM/IEEE 43rd Annual International Symposium on Computer Architecture, Seoul, Oct. 2016. [URL:https://www.cs.utah.edu/-rajeev/pubs/isca16.pdf; pp. 1-4.].

PCT Search Report and Written Opinion mailed on Jan. 20, 2025 corresponding to the related PCT Patent Application No. US2024/032870.

Taiwanese Office Action mailed on Dec. 24, 2025 corresponding to the related Taiwanese Patent Application No. 114107799. (Chinese and English translations are attached.).

* cited by examiner 10
24
22
20
26
14
22
20
24
18
18
16
16
12
10

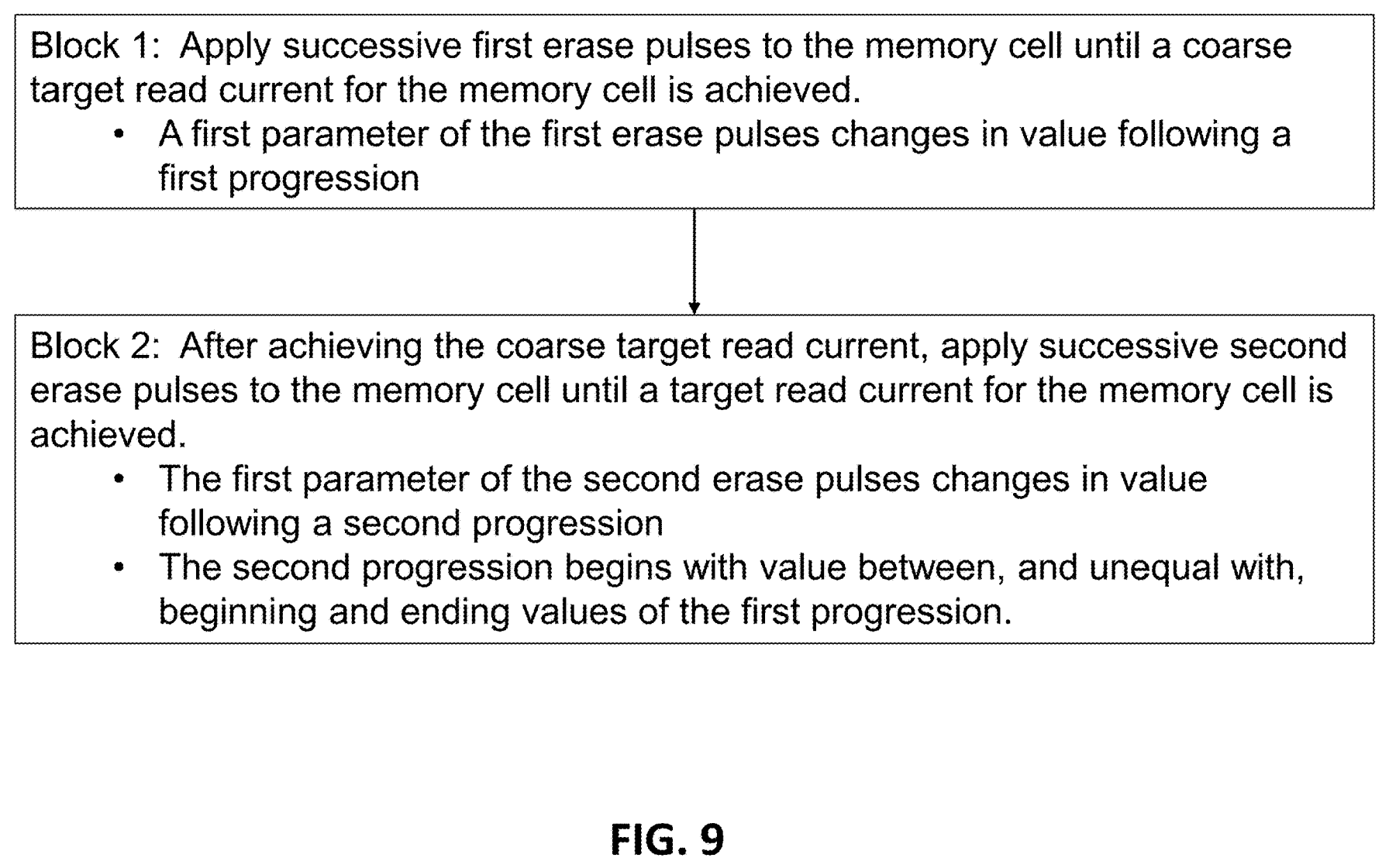

Block 1: Apply successive first erase pulses to the memory cell until a coarse target read current for the memory cell is achieved.

- A first parameter of the first erase pulses changes in value following a first progression Block 2: After achieving the coarse target read current, apply successive second erase pulses to the memory cell until a target read current for the memory cell is achieved.

- The first parameter of the second erase pulses changes in value following a second progression
- The second progression begins with value between, and unequal with, beginning and ending values of the first progression.

FIG. 9

SEQUENTIAL ERASE FOR TUNING THE PROGRAM STATE OF NON-VOLATILE MEMORY CELLS

RELATED APPLICATIONS

This application claims the benefit of U.S. Provisional Application No. 63/563,304, filed Mar. 8, 2024, and which is incorporated herein by reference.

FIELD OF THE INVENTION

The present invention relates to non-volatile memory cells, and more particularly to a technique of tuning the program state of non-volatile memory cells through sequential erase of the memory cells.

BACKGROUND OF THE INVENTION

Split-gate non-volatile memory devices are well known in the art. See for example U.S. Pat. No. 7,868,375, which discloses a four-gate memory cell configuration, and which is incorporated herein by reference for all purposes. Specifically, FIG. 1 of the present disclosure illustrates a pair of split gate memory cells 10 each with a source region 14 and a drain region 16 formed in a semiconductor substrate 12 (e.g. silicon). The source region 14 can be referred to as a source line SL (because it commonly is connected to other source regions for other memory cells in the same row or column), and the drain region 16 is commonly connected to a bit line. A channel region 18 of the semiconductor substrate 12 extends between the source region 14 and drain region 16. A floating gate 20 is disposed over (i.e., vertically over with lateral overlap) and insulated from (and directly controls the conductivity of) a first portion of the channel region 18 (and partially over and insulated from the source region 14). A control gate 22 is disposed over and insulated from the floating gate 20. A select gate 24 (also referred to as a word line gate) is disposed over and insulated from (and directly controls the conductivity of) a second portion of the channel region 18. An erase gate 26 is disposed over and insulated from the source region 14 and is laterally adjacent to the floating gate 20. The erase gate 26 can include a notch that faces an edge of the floating gate 20.

A plurality of such memory cells 10 can be arranged in rows and columns to form a memory cell array, as illustrated in FIG. 2. While FIG. 1 only shows a pair of memory cells 10 (sharing a common source region 14 and erase gate 26), the memory cell pairs can be placed end to end to form a column of memory cells (where the memory cell pairs can share a common drain region). While only two such columns are shown in FIG. 2, there can be many such columns. Each column can include a bit line 16*a* electrically connecting together all the drain regions 16 in the column. Each column of memory cells 10 can include an erase gate line 26*a* electrically connecting together all the erase gates 26 in the column of memory cells. For example, all the erase gates 26 in each column of memory cell pairs can be formed as a continuous line of conductive material, where a portion of the continuous line passing through any given memory cell serves as its erase gate 26. Each row of memory cells 10 can include a control gate line 22*a* electrically connecting together all the control gates 22 in the row of memory cells. For example, all the control gates 22 in each row of memory cells 10 can be formed as a continuous line of conductive material, where a portion of the continuous line passing through any given memory cell serves as its control gate 22.

Each row of memory cells 10 can include a select gate line 24*a* electrically connecting together all the select gates 24 in the row of memory cells. For example, all the select gates 24 in each row of memory cells can be formed as a continuous line of conductive material, where a portion of the continuous line passing through any given memory cell serves as its select gate 24. Finally, each row of memory cell pairs can include a source line 14*a* electrically connecting together all the source regions 14 in the row of memory cell pairs. For example, all the source regions 14 in each row of memory cell pairs can be formed as a continuous line of conductive diffusion in the substrate 12, where a portion of the continuous line passing through any given memory cell pair serves as its source region 14. By having the bit lines 16*a* and erase gate lines 26*a* extending in the column direction, and the source lines 14*a*, control gate lines 22*a* and select gate lines 24*a* extending in the row direction, any memory cell in the array can be individually programmed, erased and read.

Various combinations of voltages are applied to the control gate 22, select gate 24, erase gate 26 and source and drain regions 14/16, to program the split gate memory cell 10 (i.e., inject electrons onto the floating gate 20), to erase the split gate memory cell 10 (i.e., remove electrons from the floating gate 20), and to read the split gate memory cell 10 (i.e., measure or detect the conductivity of the channel region 18, by for example measuring or detecting a read current through the channel region 18, to determine the programming state of the floating gate 20).

Split gate memory cell 10 can be operated in a digital manner, where the split gate memory cell 10 is set to one of only two possible states: a programmed state and an erased state. The split gate memory cell 10 is erased by placing a high positive voltage on the erase gate 26, and optionally a negative voltage on the control gate 22, to induce tunneling of electrons from the floating gate 20 to the erase gate 26 (leaving the floating gate 20 in a more positively charged state—the erased state). Split gate memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate 20 in a more negatively charged state—the programmed state).

One technique to program the memory cells is sequential programming, which involves applying the programming voltages as a series of pulses, with each pulse of programming voltages injecting more electrons onto the floating gate thus increasing the program state of the memory cell with each pulse, until the desired programming state is achieved. With sequential programming, there can be intervening read operations between the programming pulses to determine if the desired programming state has been achieved by the last applied programming pulse (in which case programming ceases) or has not been achieved (in which case programming continues with one or more programming pulses). For example, each desired program state can be associated with a target read current Irtarget (i.e., the desired and therefore target current through the channel region 18 during a read operation that is associated with the desired program state). The higher the program state (i.e., the more electrons on the floating gate), the lower the read current Ir. Therefore, read current Ir will drop after each programming pulse. Once a target read current Irtarget is reached (reflecting the desired program state), i.e. Ir=Irtarget, programming for that memory cell ceases.

If the same set of program voltages are applied during each pulse in sequential programming, the programming amount drops pulse to pulse, because as the floating gate becomes more negatively charged with each programming pulse, fewer electrons are injected onto the floating gate if the parameters of the programming pulses (applied voltages, supplied current, duration) remain constant. Therefore, each time a memory cell is determined to have not reached its desired programming state after any given pulse, one or more of the programming parameters can be increased to a higher value in the next pulse, to compensate for the dropping pulse-to-pulse programming amount that would otherwise occur. For example, for the memory cell of FIG. 1, programming parameters that can be increased from one programming pulse to the next programming pulse can include increases in one or more of the following: voltage applied to the control gate, voltage applied to the erase gate, voltage applied to the source region, current supplied to the drain region, and duration of the programming pulse.

Split gate memory cell 10 can be read by placing positive voltages on the select gate 24 (turning on the portion of channel region 18 under the select gate 24 by making it conductive) and drain region 16 (and optionally on the erase gate 26 and the control gate 22), and sensing current flow through the channel region 18. If the floating gate 20 is positively charged (i.e. split gate memory cell 10 is erased), the split gate memory cell 10 will turn on because the both portions of the channel region 18 are conductive due to the lack of electrons on the floating gate 20, and electrical current will flow from drain region 16 to source region 14 (i.e. the split gate memory cell 10 is sensed to be in its erased "1" state based on sensed current flow). If the floating gate 20 is negatively charged (i.e. split gate memory cell 10 is programmed), the portion of channel region 18 under the floating gate is turned off (low conductivity), thereby preventing appreciable current flow (i.e., the split gate memory cell 10 is sensed to be in its programmed "0" state based on no, or minimal, current flow). Memory cells 10 are considered non-volatile because they maintain their program state even when power is not applied to the semiconductor device. Memory cells 10 can be referred to as split gate memory cells because two different gates (floating gate 20 and select gate 24), respectively, directly control the conductivity of two different portions of the channel region 18.

Split gate memory cell 10 can alternately be operated in an analog manner where the memory state (i.e. the amount of charge, such as the number of electrons, on the floating gate 20) of the split gate memory cell 10 can be incrementally changed anywhere from a fully erased state (minimum number of electrons on the floating gate 20) to a fully programmed state (maximum number of electrons on the floating gate 20), or just a portion of this range. This means the split gate memory cell 10 storage is analog, which allows for very precise and individual tuning of each split gate memory cell 10 in an array of split gate memory cells 10. Alternatively, the split gate memory cell 10 could be operated as an MLC (multilevel cell) where it is configured to be programmed to one of many discrete values (such as 16 or 64 different values).

Split gate memory cells with fewer gates are also known. For example, FIG. 3 illustrates known split gate memory cells 10 that are the same as that of FIG. 1, except the control gates 22 are omitted. See for example U.S. Pat. No. 7,315,056. Voltage coupling to the floating gate 20 provided by the control gate 22 of the split gate memory cell of FIG. 1 is provided instead by the erase gate 26 and source region 14 of the split gate memory cell in FIG. 3. FIG. 4 illustrates an example layout of an array of the split gate memory cells 10 of FIG. 3. By having the bit lines **16*a* and erase gate lines 26*a* extending in the column direction, and the source lines 14*a* and select gate lines 24*a*** extending in the row direction, any memory cell in the array can be individually programmed, erased and read.

As another example, FIG. 5 illustrates known split gate memory cells 10 that are similar to that of FIG. 1, except the control gates 22 and the erase gates 26 are omitted. See for example U.S. Pat. No. 5,029,130. The erase voltage for the split gate memory cell of FIG. 5 is applied to the select gate 24, which has a first portion laterally adjacent the floating gate 20, and a second portion that extends up and over the floating gate 20. FIG. 6 illustrates an example layout of an array of the split gate memory cells 10 of FIG. 5. By having the bit lines **16*a* and source lines 14*a* extending in the column direction, and the select gate lines 24*a*** extending in the row direction, any memory cell in the array can be individually programmed, erased and read.

As yet another example, FIG. 7 illustrates known split gate memory cells 10 that are similar to that of FIG. 5, except a conductive block of material 28 is formed in contact with source region 14, to serve as an extended source line. See for example U.S. Pat. No. 6,855,980. An example layout for an array of the split gate memory cells 10 of FIG. 7 can be the same as that in FIG. 6.

While any of the split gate memory cells 10 of FIGS. 1, 3, 5 and 7 can be operated in a digital manner, analog manner, or as an MLC, an improved accuracy and efficiency of memory cell programming for analog and MLC operation is needed.

BRIEF SUMMARY OF THE INVENTION

The aforementioned problems and needs are addressed by a method of erasing a memory cell including a floating gate, comprising applying successive first erase pulses to the memory cell to remove electrons from the floating gate until a coarse target read current for the memory cell is achieved, wherein the first erase pulses include a first parameter following a first progression in which the first parameter changes in value after respective ones of the first erase pulses and wherein the first progression begins with a first value of the first parameter and ends with a second value of the first parameter; and after the coarse target read current is achieved, applying successive second erase pulses to the memory cell to remove electrons from the floating gate until a target read current for the memory cell is achieved, wherein the second erase pulses include the first parameter following a second progression in which the first parameter changes in value after respective ones of the second erase pulses, wherein the second progression begins with a third value of the first parameter that is between, and unequal to, the first and second values.

A semiconductor device comprises a memory cell including a floating gate, and a control circuitry. The control circuitry to apply successive first erase pulses to the memory cell to remove electrons from the floating gate until a coarse target read current for the memory cell is achieved, wherein the first erase pulses include a first parameter following a first progression in which the first parameter changes in value after respective ones of the first erase pulses and wherein the first progression begins with a first value of the first parameter and ends with a second value of the first parameter; and after the coarse target read current is achieved, apply successive second erase pulses to the memory cell to remove electrons from the floating gate until a target read current for the memory cell is achieved, wherein the second erase pulses include the first parameter following a second progression in which the first parameter changes in value after respective ones of the second erase pulses, wherein the second progression begins with a third value of the first parameter that is between, and unequal to, the first and second values.

Other objects and features of the present invention will become apparent by a review of the specification, claims and appended figures.

BRIEF DESCRIPTION OF THE DRAWINGS

FIG. 9 is a flow diagram of a method of using successive first erase pulses with a first progression and successive second erase pulses with a second progression in an erase operation.

DETAILED DESCRIPTION OF THE INVENTION

Figures 1, 2:
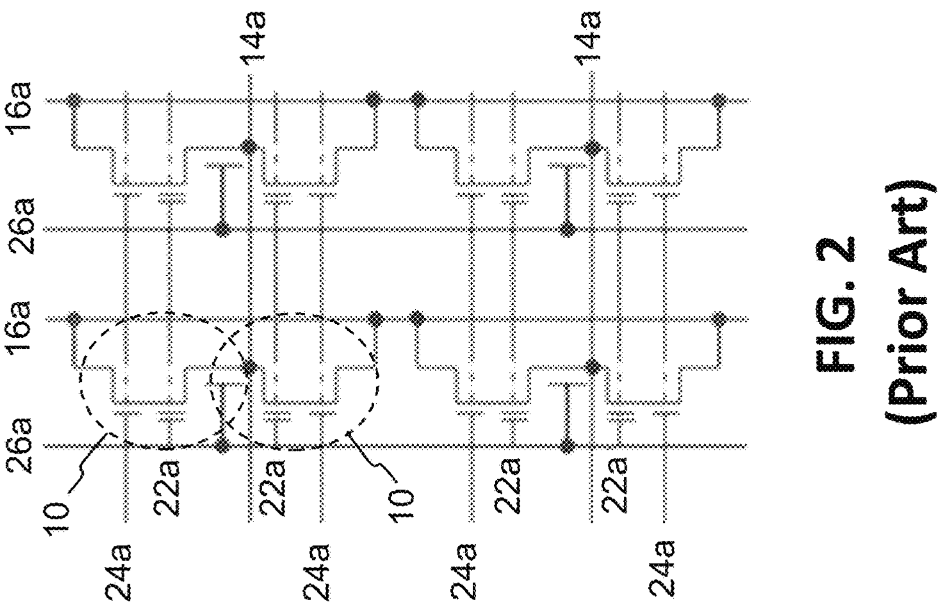
FIG. 1 is a cross sectional view of a conventional pair of memory cells.
FIG. 2 is a schematic and layout diagram of a conventional memory cell array of the memory cells of FIG. 1.
Figures 3, 4:
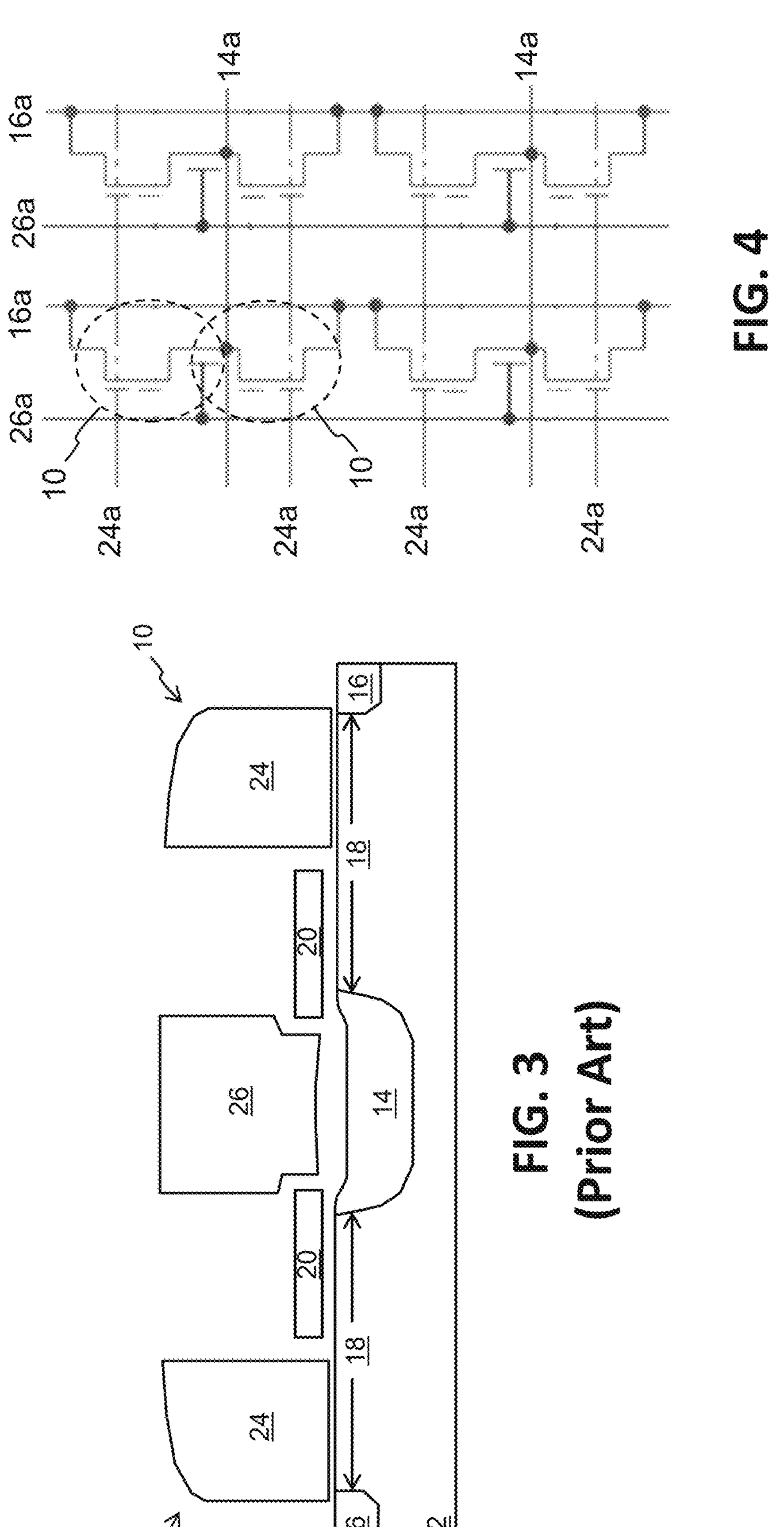
FIG. 3 is a side cross sectional view of a conventional pair of memory cells.
FIG. 4 is a schematic and layout diagram of a conventional memory cell array of the memory cells of FIG. 3.
Figure 6:
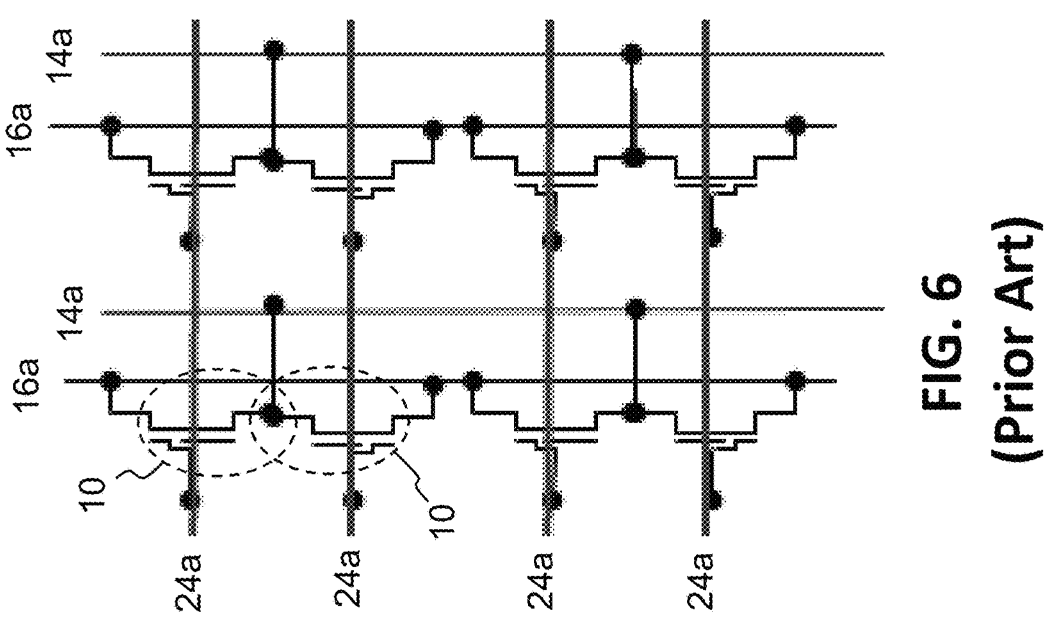
FIG. 6 is a schematic and layout diagram of a conventional memory cell array of the memory cells of FIG. 5.
Figure 5:
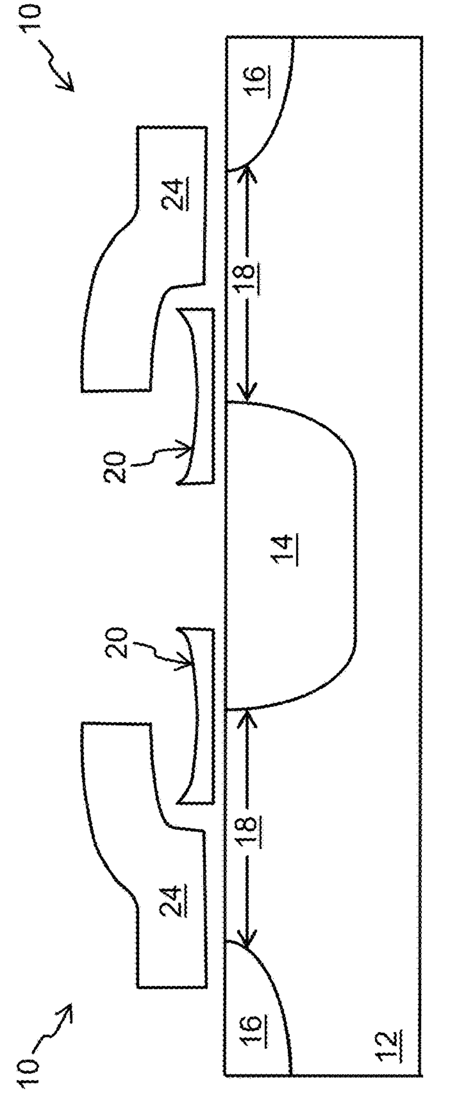
FIG. 5 is a side cross sectional view of a conventional pair of memory cells.
Figure 7:
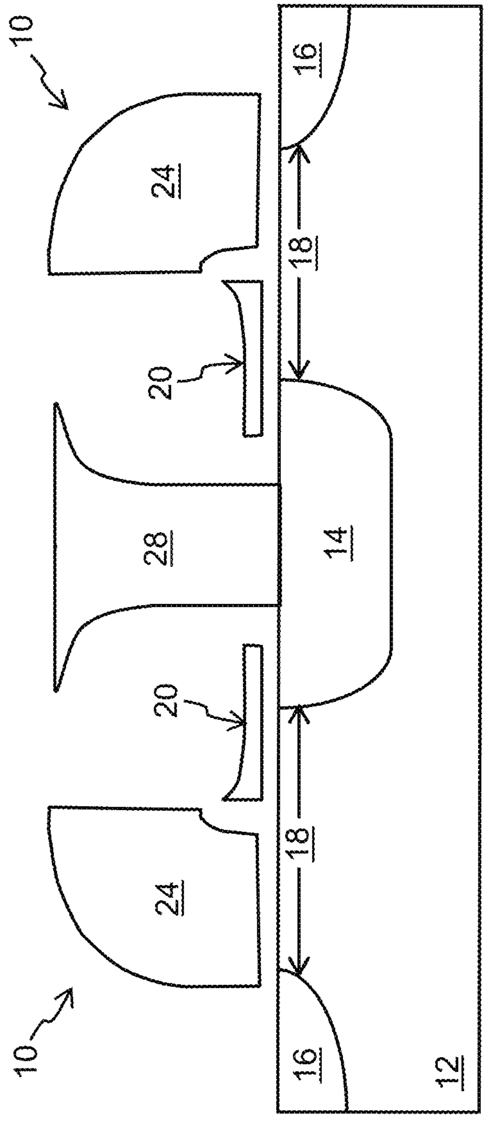
FIG. 7 is a side cross sectional view of a conventional pair of memory cells.
Figure 8:
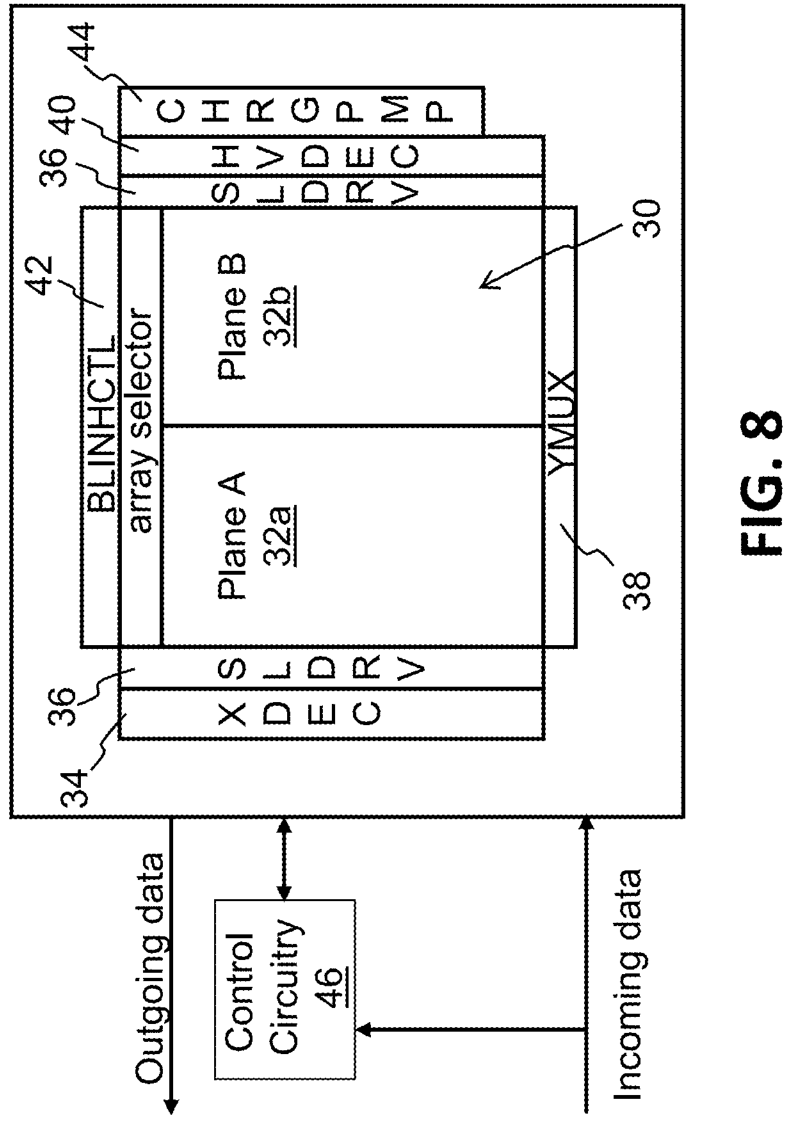
FIG. 8 is a diagram illustrating components of a memory device.

The present examples illustrate memory cell tuning methods that include sequential erase to achieve desired programming states. The tuning methods can be implemented as part of control circuitry 46, which controls the various device elements for a memory array, which can be better understood from the architecture of an example memory device as illustrated in FIG. 8. The memory device includes an array 30 of the split gate memory cells 10, which can be segregated into two separate planes (Plane A 32*a* and Plane B 32*b*). The split gate memory cells 10 can be of the type shown in FIG. 1, 3, 5 or 7, arranged in a plurality of rows and columns in the semiconductor substrate 12 as illustrated in FIG. 2, 4 or 6, and thus formed on a single chip. Adjacent to the array of array 30 of split gate memory cells 10 are an address decoder 34 (e.g., XDEC), source line drivers 36 (e.g., SLDRV), a column decoder 38 (e.g., YMUX), a high voltage row decoder 40 (e.g., HVDEC) and a bit line controller 42 (e.g., BLINHCTL), which are used to decode addresses and supply the various voltages to the various gates and regions of the split gate memory cells 10 during read, program, and erase operations for selected split gate memory cells 10 of the array 30. Column decoder 38 includes a sense amplifier containing circuitry for measuring the currents on the bit lines during a read operation. Control circuitry 46 controls the various device elements to implement each operation (program, erase, read) on selected split gate memory cells 10 of the array 30 as described herein. Charge pump 44 (e.g., CHRGPMP) provides the various voltages used to read, program and erase the selected split gate memory cells 10 of the array 30, under the control of the control circuitry 46. Control circuitry 46 operates the memory device to program, erase and read the selected split gate memory cells 10 of the array 30. As part of these operations, the control circuitry 46 can be provided with access to incoming data which is data to be programmed to the selected split gate memory cells 10 of the array 30, along with program, erase and read commands provided on the same or different lines. Data read from the array 30 (i.e., from selected split gate memory cells 10 of the array 30) is provided as outgoing data.

The tuning method involves the control circuitry 46 implementing memory cell sequential erasing. Thus, control circuitry 46 may be loaded with software, i.e. non-transitory electronically readable instructions, or firmware, or can consist of respective circuits, or any combination thereof, to perform the techniques described herein. Control circuitry 46 may be implemented by a microcontroller, dedicated circuitry, a processor, a general purpose processor running firmware or software, or a combination thereof.

In analog memory cell operation, programming can be performed by applying the programming voltages in discrete pulses, with intervening read operations to verify the programming state between programming pulses (i.e., sequential programming). Specifically, after each program pulse, a program verify read operation is performed to determine if the selected cells have reached their respective target program state (i.e., reached their target read current Irtarget associated with the target program state). If the determination is yes for any given memory cell, then a program inhibit voltage can be applied for that given memory cell so that subsequent program pulses for the other cells do not further program the given memory cell. For example, once a memory cell is determined to have achieved its target program state, a program inhibit voltage can be applied to the corresponding bit line to prevent any further programming of that memory cell. Memory cells determined to have not reached their target program states are programmed with additional program pulses (also referred to as a program retry pulse train), often with an increase in program voltage (e.g., for the memory cell of FIG. 1, the program voltage(s) placed on the control gate 22, select gate 24, erase gate 26, source region 14 or a combination thereof can be increased higher and higher, program pulse to program pulse). The program retry pulse train continues until all the memory cells to be programmed have reached their target program states.

If a split gate memory cell 10 is determined to be at a program state which surpasses its target program state by an undesirable amount (e.g., determined through a read operation), the memory cell can be erased (whereby electrons are removed from the floating gate 20), followed by programming (e.g., sequential programming) until the memory cell reaches the target read current Irtarget corresponding to the target program state without an undesirable amount of overprogramming.

However, in the present example, sequential erasing is used to fine tune the program state until the memory cell reaches the target read current Irtarget corresponding to the target program state, thereby avoiding further sequential programming in the case where the memory cell is overprogrammed. Erasing can be performed by applying an erase voltage(s) in discrete pulses, with intervening read operations to verify the programming state between erase pulses (i.e., sequential erasing). Read current Ir (during the read operations) will increase after each erase pulse. Once a target read current Irtarget is reached (reflecting the target program state), erasing for that memory cell ceases. Specifically, after each erase pulse, a program verify read operation is performed to determine if the selected cells have reached their respective target program state (i.e., the read current Ir reached the target read current Irtarget associated with the target program state). If the determination is yes for any given memory cell, then the erase operation ceases, or in the case that the erase operation continues for other memory cells, then an erase inhibit voltage can be applied to that given memory cell so that subsequent erase pulses for the other cells do not further erase the given memory cell. For example, once a memory cell is determined to have achieved its desired program state, an erase inhibit voltage can be applied to the corresponding control gate line 22*a* or source region 14 to prevent any further erasing of that memory cell. Memory cells determined to have not reached their desired program states are erased with additional erase pulses until the target read current Irtarget and thus associated target program state are reached.

If the same erase voltage(s) are applied during each pulse in sequential erasing, the amount of erasing (i.e., the number of electrons removed from the floating gate) drops pulse to pulse, because as the floating gate becomes more positively charged with each pulse, fewer electrons tunnel off of the floating gate if the parameters of the erase pulses (applied voltage(s), duration) remain constant. Therefore, each time a memory cell is determined to have not reached its target read current Irtarget (and therefore its target program state) after any given erase pulse, one or more of the erase parameters can be changed to a different value in the next pulse, to compensate for the dropping pulse-to-pulse erasing amount that would otherwise occur. For example, for the memory cell of FIG. 1, erase parameters that can be changed to a different value from one erase pulse to the next erase pulse can include one or more of the following: an increase in the voltage applied to the erase gate 26 (i.e., more positive), a decrease in the voltage applied to the control gate 22 (i.e., more negative), an increase in the duration of the erase pulse, or any combination of the foregoing. For clarity, as used herein, changing a voltage to be more negative is a decrease in the voltage (e.g., changing the voltage from −1.0V to −1.1V is a decrease in the voltage). For the memory cell of FIG. 3, erase parameters that can be changed to a different value from one erase pulse to the next erase pulse can include one or more of the following: an increase in the voltage applied to the erase gate 26, an increase in the duration of the erase pulse, or a combination of the foregoing. For the memory cells of FIGS. 5 and 7, erase parameters that can be changed to a different value from one erase pulse to the next erase pulse can include one or more of the following: an increase in the voltage applied to the select gate 24, an increase in the duration of the erase pulse, or a combination of the foregoing.

While changing one or more of the erase parameters after each erase pulse can effectively maintain more or less of a constant rate of erasing pulse to pulse, thereby reducing the number of erase pulses needed to reach the target read current Irtarget (and therefore the corresponding target program state), it may raise the likelihood of over erasing the memory cell so that an undesired program state is achieved corresponding to a read current Ir that is undesirably greater than the target read current Irtarget, which would require programming the memory cell again. To reduce the likelihood of over erasing the memory cell, an erase operation can apply successive first erase pulses, followed by successive second erase pulses, where the successive second erase pulses begin by erasing the memory cell less aggressively than at an end of the successive first erase pulses. This results in reducing the rate of erasure per pulse at the beginning of the successive second erase pulses, thereby reducing the likelihood of an undesired over-erasure of the memory cell.

FIG. 9 sets forth sequential erasing a memory cell with a floating gate using successive first erase pulses and successive second erase pulses. In Block 1, successive first erase pulses are applied to the memory cell to remove electrons from the floating gate until a coarse target read current for the memory cell is achieved (confirmed by intervening read operations between the first erase pulses). The first erase pulses include a first parameter, such as a voltage or a time duration, that follows a first progression in which the first parameter changes in value after respective ones of the first erase pulses. The first progression begins with a first value of the first parameter and ends with a second value of the first parameter. In Block 2, after achieving the coarse target read current, successive second erase pulses are applied to the memory cell to remove electrons from the floating gate until a target read current for the memory cell is achieved. The second erase pulses include the first parameter following a second progression in which the first parameter changes in value after respective ones of the second erase pulses. The second progression begins with a third value of the first parameter that is between, and unequal to, the first and second values. This method results in slowing down the rate of erasure as the read current in the intervening read operations between the erase pulses reaches the coarse target read current, by starting the second progression with a value of the first parameter that is between the start and ending values of the first parameter in the first progression.

Figure 10:
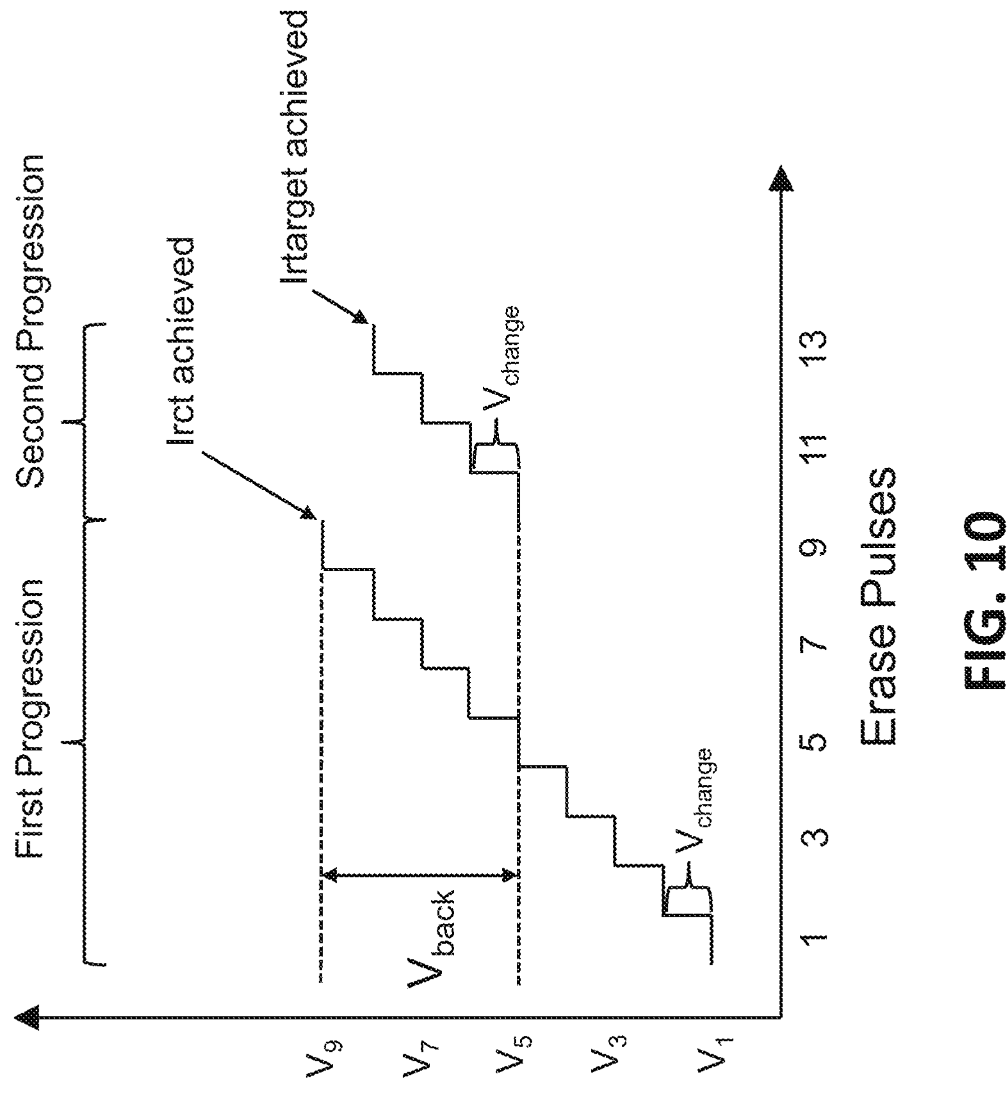
FIG. 10 is a plot illustrating the first and second progressions of erase voltages applied during erase pulses of a first example.

FIG. 10 provides a non-limiting example of the sequential erasing method of FIG. 9. In this example, erase voltage Ver is applied in pulses to remove electrons from the floating gate (e.g., by placing erase voltage Ver on erase gate 26 of the memory cells of FIGS. 1 and 5 or on select gate 24 of the memory cells of FIGS. 5 and 7), with intervening read operations to determine read current Ir. In this example, the erase voltage Ver is the first parameter. The erase method begins by applying successive first erase pulses where the value of erase voltage Ver in the first pulse is V1. The value of erase voltage Ver in the second pulse is V2, where $V2=V1+V_{change}$. The value of erase voltage Ver in the third pulse is V3, where $V3=V2+V_{change}$, and so on. The erase voltage Ver in each first erase pulse changes relative to that in the previous first erase pulse, and is the value of the erase voltage Ver in the previous pulse, plus the change value $V_{change}$. Therefore, the first progression in which the first parameter changes in value in this example is erase voltage Ver changing in value where that change is an increase of $V_{change}$ from one pulse to the next pulse. In this example, change value $V_{change}$ is constant pulse to pulse, but in other examples, change value $V_{change}$ can vary pulse to pulse. The read current Ir is determined in a read operation after each erase pulse, where the read current Ir increases as a result of each erase pulse.

Once the read current Ir reaches a coarse target read current Irct, where coarse target read current Irct is less than Itarget, then the first erase pulses end and the second erase pulses begin. For the first pulse of the second erase pulses, the erase voltage Ver is equal to its value in the last pulse of the first erase pulses, minus a decrease of $V_{back}$, where $V_{back}$ is a change back voltage that places erase voltage Ver in the first pulse of the second erase pulses between, and not equal to, the start value V1 and end value V9 of the first erase pulses. In the example of FIG. 10, coarse target read current Irct is achieved after the ninth pulse of the first erase pulses. In this example, the erase voltage Ver of the first pulse of the second erase pulses is V9 (the erase voltage of the previous erase pulse) minus the change back voltage $V_{back}$. Thereafter, the sequential erasing continues as before the change back in voltage, where the erase voltage Ver of each successive second erase pulse is the voltage of the previous second erase pulse plus the change value $V_{change}$, until the target read voltage Irtarget is achieved. In the example of FIG. 10, the target read current Irtarget is achieved after the thirteenth pulse (9 pulses of the first erase pulses, and 4 pulses of the second erase pulses). By including the change back voltage $V_{back}$ at the beginning of the second progression of the erase voltage Ver in the second erase pulses, the amount of erasing per pulse is slowed, and therefore the chances of over erasing the memory cell is reduced. It should be noted that if other voltages are being changed pulse to pulse, they too can include a change back in their progression at the transition from the first erase pulses to the second erase pulses, no matter if the progression is going up (in which case the change back is down to a lower value) or going down (in which case the change back is up to a higher value).

Figure 11:
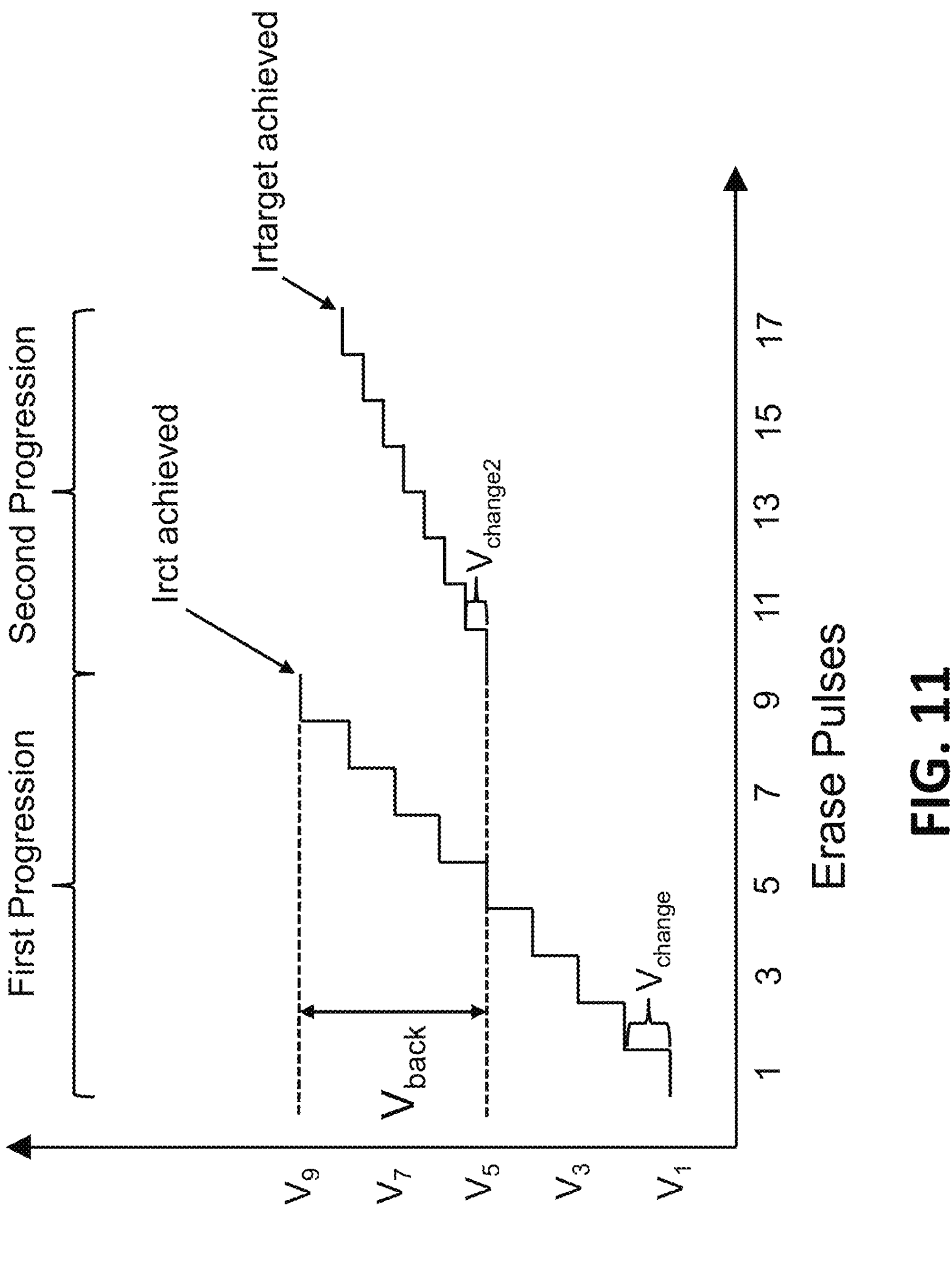
FIG. 11 is a plot illustrating the first and second progressions of erase voltages applied during erase pulses of another example.

FIG. 11 illustrates another non-limiting example similar to the example of FIG. 10, but where the change value $V_{change2}$ for the second erase pulses is less than (e.g., half of) the change value $V_{change}$ for the first erase pulses, to further slow the amount of erasing per pulse for the second erase pulses. Reducing the value of the change value $V_{change?}$ relative to the change value $V_{change}$ will increase the number of second erase pulses needed to reach the target read current Irtarget, but will also increase precision and further reduce the chances of over erasing the memory cell.

Figure 12:
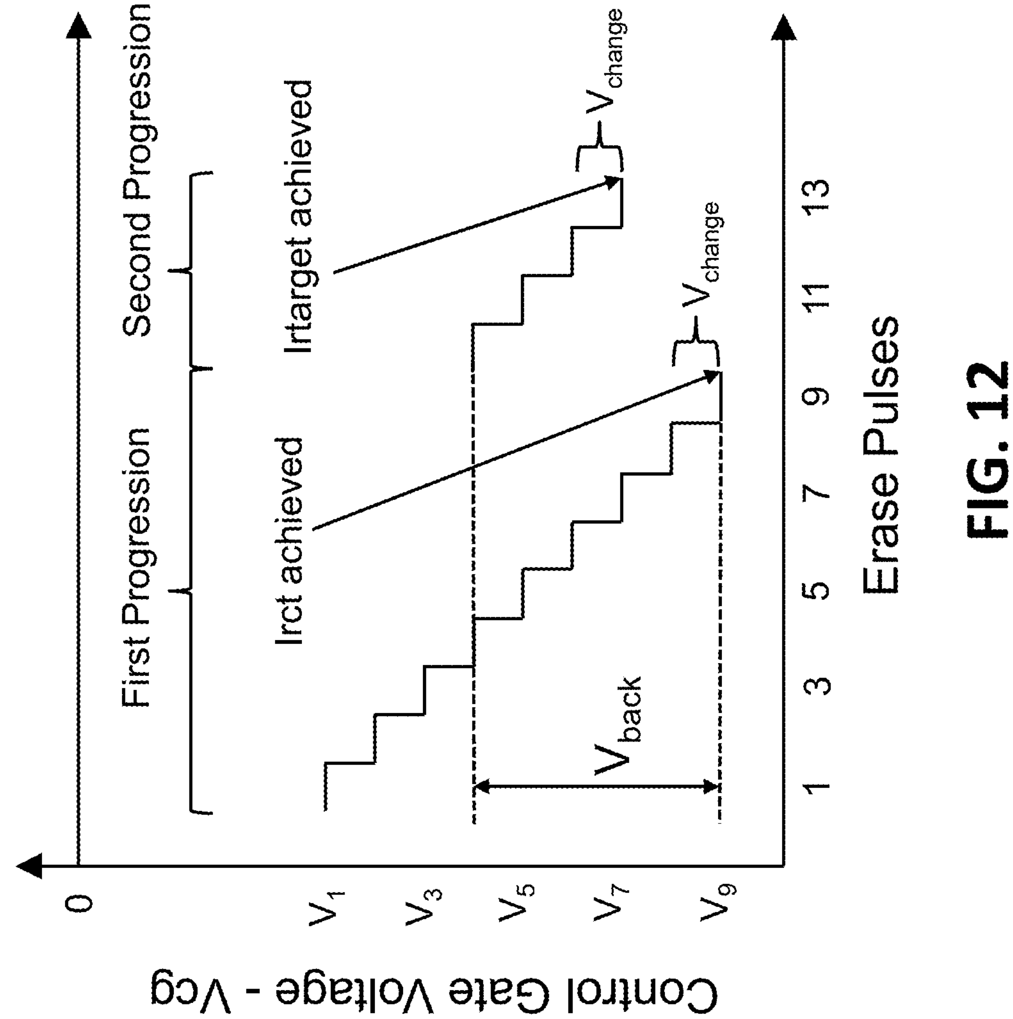
FIG. 12 is a plot illustrating the first and second progressions of erase voltages applied during erase pulses of another example.

FIG. 12 illustrates another non-limiting example of the sequential erasing method of FIG. 9, where the first parameter is the negative voltage applied to the control gate 22 of the memory cell of FIG. 1. In this example, control gate voltage Veg is applied in pulses to the control gate, in combination with Ver applied to the erase gate 26, to assist in removing electrons from the floating gate 20, with intervening read operations to determine read current Ir. The erase method begins by applying successive first erase pulses where the value of control gate voltage Veg in the first pulse is V1. The value of control gate voltage Veg in the second pulse is V2, where V2=V1−$V_{change}$. (i.e., making Veg more negative in the second pulse compared to the first pulse). The value of control gate voltage Veg in the third pulse is V3, where V3=V2−$V_{change}$, and so on. Therefore, the first progression in which the first parameter changes in value in this example is control gate voltage Veg changing in value where the change is a decrease of $V_{change}$ from one pulse to the next pulse. In this example, change value $V_{change}$ is constant pulse to pulse, but in other examples, change value V change can vary pulse to pulse. The read current Ir is determined in a read operation after each erase pulse, where the read current Ir increases as a result of each erase pulse.

Once the read current Ir reaches a coarse target read current Irct, where coarse target read current Irct is less than Itarget, then the first erase pulses end and the second erase pulses begin. For the first pulse of the second erase pulses, the control gate voltage Veg is equal to its value in the last pulse of the first erase pulses, plus an increase of $V_{back}$, where $V_{back}$ is a change back voltage that places control gate voltage Veg in the first pulse of the second erase pulses between, and not equal to, the start value V1 and end value V9 of the first erase pulses. In the example of FIG. 12, coarse target read current Irct is achieved after the ninth pulse of the first erase pulses. In this example, the control gate voltage Veg of the first pulse of the second erase pulses is V9 (the control gate voltage of the previous erase pulse) plus the change back voltage $V_{back}$. Thereafter, the sequential erasing continues as before the change back in voltage, where the control gate voltage Veg of each successive second erase pulse is the voltage of the previous second erase pulse minus the change value $V_{change}$, until the target read voltage Irtarget is achieved. In the example of FIG. 12, the target read current Irtarget is achieved after the thirteenth pulse (9 pulses of the first erase pulses, and 4 pulses of the second erase pulses). By including the change back voltage $V_{back}$ at the beginning of the second progression of the control gate voltage Veg in the second erase pulses, the amount of erasing per pulse is slowed, and therefore the chances of over erasing the memory cell is reduced.

Figure 13:
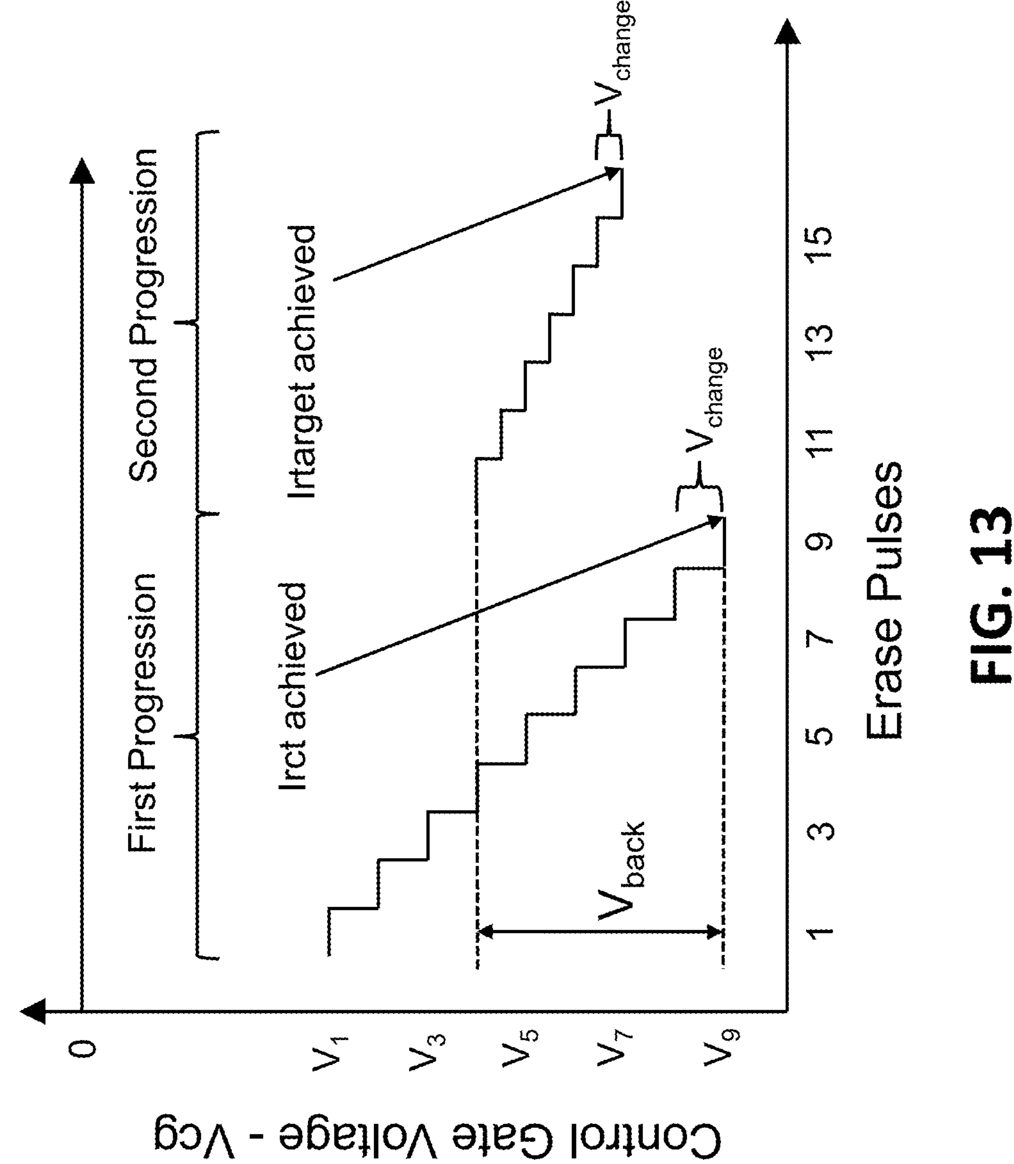
FIG. 13 is a plot illustrating the first and second progressions of erase voltages applied during erase pulses of another example.

FIG. 13 illustrates another non-limiting example similar to the example of FIG. 12, but where the change value $V_{change2}$ for the second erase pulses is less than (e.g., half of) the change value $V_{change}$ for the first erase pulses, to further slow the amount of erasing per pulse for the second erase pulses. Reducing the value of the change value $V_{change?}$ relative to the change value $V_{change}$ will increase the number of second erase pulses needed to reach the target read current Irtarget, but will also increase precision and further reduce the chances of over erasing the memory cell.

Figure 14:
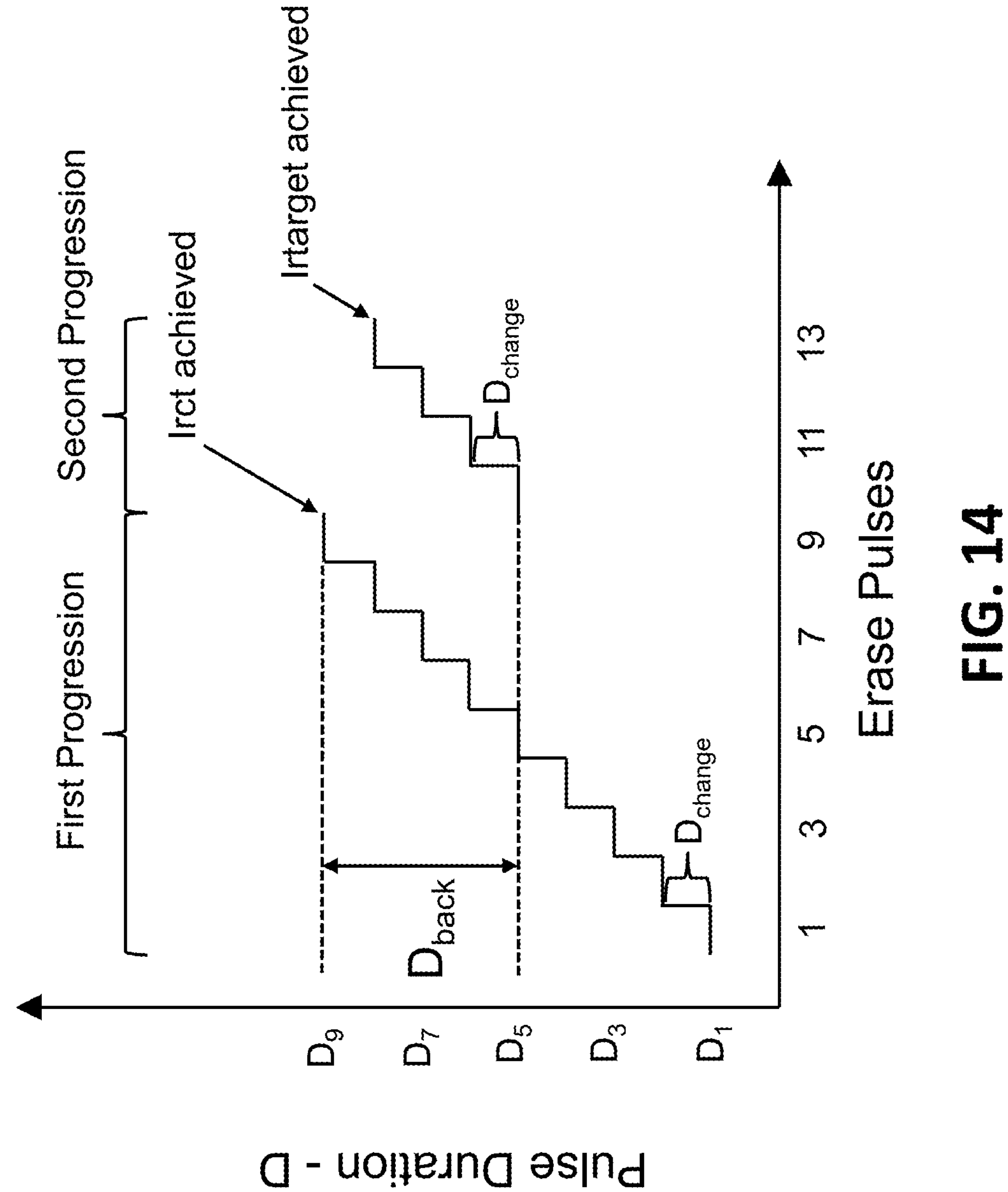
FIG. 14 is a plot illustrating the first and second progressions of erase pulse durations of another example.

FIG. 14 provides another non-limiting example of the sequential erasing method of FIG. 9, where the first parameter is the duration D of each of the respective erase pulses. In this example, the erase method begins by applying successive first erase pulses where the duration of the first pulse is D1. The duration of the second pulse is D2, where D2=D1+$D_{change}$. The duration of the third pulse is D3, where D3=D2+$D_{change}$, and so on. Therefore, the first progression in which the first parameter changes in value in this example is the duration D changing in value where the change is an increase of duration by change value $D_{change}$ from one pulse to the next pulse. In this example, change value $D_{change}$ is constant pulse to pulse, but in other examples, duration change value $D_{change}$ can vary pulse to pulse. The read current Ir is determined in a read operation after each erase pulse, where the read current Ir increases as a result of each erase pulse.

Once the read current Ir reaches a coarse target read current Irct, where coarse target read current Irct is less than Itarget, then the first erase pulses end and the second erase pulses begin. For the first pulse of the second erase pulses, the duration D is equal to its value in the last pulse of the first erase pulses, minus $D_{back}$, where $D_{back}$ is a change back duration that places the duration D of the first pulse of the second erase pulses between, and not equal to, the start value D1 and end value D9 of the duration of the first erase pulses. In the example of FIG. 14, coarse target read current Irct is achieved after the ninth pulse of the first erase pulses. In this example, the duration D the first pulse of the second erase pulses is D9 (the duration of the previous erase pulse) minus the change back duration $D_{back}$. Thereafter, the sequential erasing continues as before the change back in duration, where the duration D of each successive second erase pulse is the duration of the previous second erase pulse plus the change value $D_{change}$, until the target read voltage Irtarget is achieved. In the example of FIG. 14, the target read current Irtarget is achieved after the thirteenth pulse (9 pulses of the first erase pulses, and 4 pulses of the second erase pulses). By including the change back duration $D_{back}$ at the beginning of the second progression of the second erase pulses, the amount of erasing per pulse is slowed, and therefore the chances of over erasing the memory cell is reduced.

Figure 15:
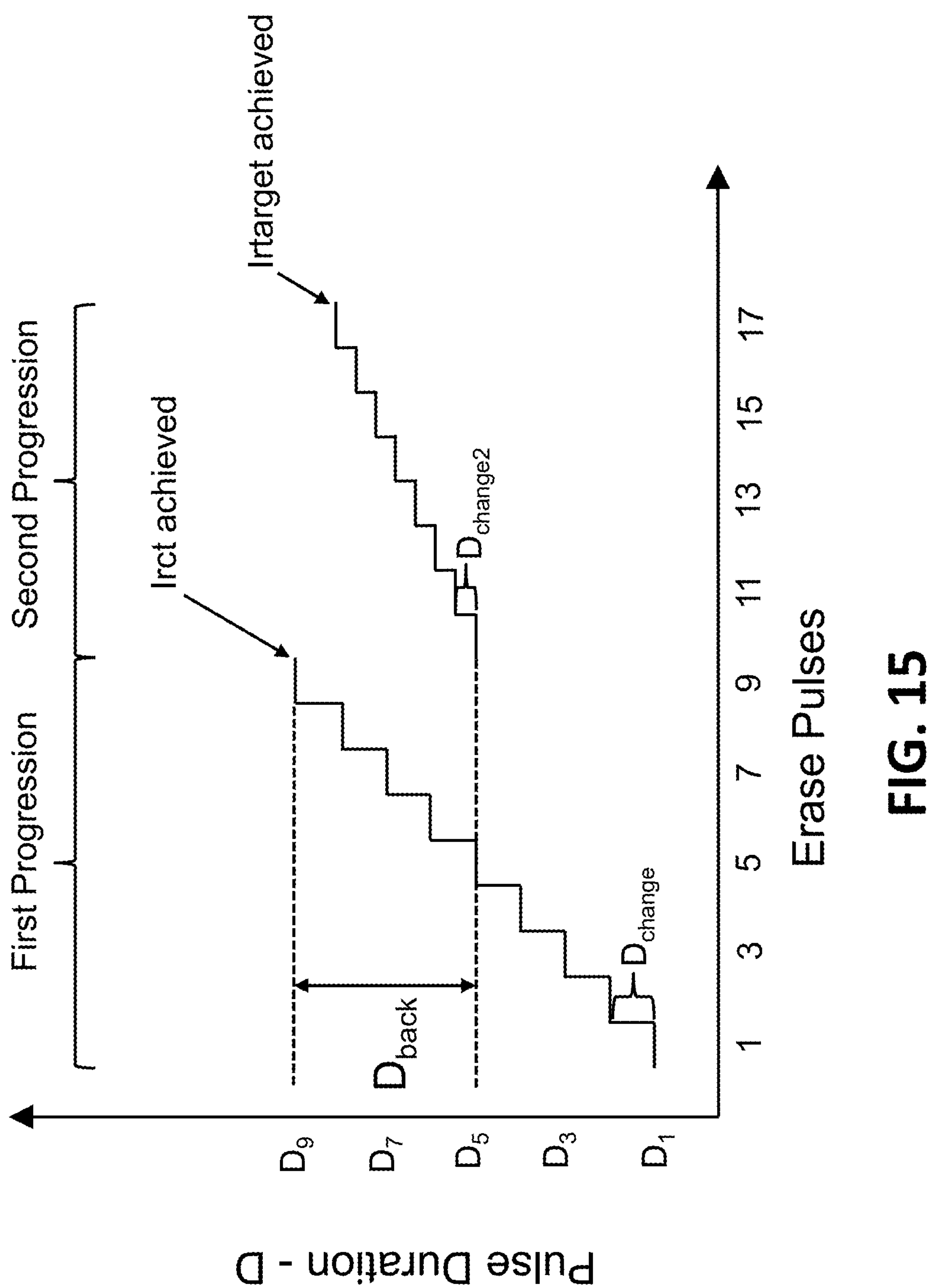
FIG. 15 is a plot illustrating the first and second progressions of erase pulse durations of another example.

FIG. 15 illustrates another non-limiting example similar to the example of FIG. 14, but where the change value $D_{change2}$ for the second erase pulses is less than (e.g., half of) the change value $D_{change}$ for the first erase pulses, to further slow the amount of erasing per pulse for the second erase pulses. Reducing the value of the change value $D_{change2}$ relative to change value $D_{change}$ will increase the number of second erase pulses needed to reach the target read current Irtarget, but will also increase precision and further reduce the chances of over erasing the memory cell.

It is to be understood that the present disclosure is not limited to the example(s) described above and illustrated herein, but encompasses any and all variations falling within the scope of any claims. For example, references to the present disclosure or invention or examples herein are not intended to limit the scope of any claim or claim term, but instead merely make reference to one or more features that may be covered by one or more claims. While the examples are described with respect to the four gate memory cell of FIG. 1, the above described techniques can be equally applied using any of the memory cell configurations of FIGS. 1, 3, 5, and 7. Materials, processes and numerical examples described above are exemplary only, and should not be deemed to limit any claims.

What is claimed is:

1. A method of erasing a memory cell including a floating gate, comprising:

applying successive first erase pulses to the memory cell to remove electrons from the floating gate until a coarse target read current for the memory cell is achieved, wherein the first erase pulses include a first parameter following a first progression in which the first parameter changes in value after respective ones of the first erase pulses and wherein the first progression begins with a first value of the first parameter and ends with a second value of the first parameter; and after the coarse target read current is achieved, applying successive second erase pulses to the memory cell to remove electrons from the floating gate until a target read current for the memory cell is achieved, wherein the second erase pulses include the first parameter following a second progression in which the first parameter changes in value after respective ones of the second erase pulses, wherein the second progression begins with a third value of the first parameter that is between, and unequal to, the first and second values.

2. The method of claim 1, wherein:

the first parameter is a voltage applied to the memory cell;

during the first progression, the voltage increases in value after respective ones of the first erase pulses, wherein the second value is greater than the first value;

during the second progression, the voltage increases in value after respective ones of the second erase pulses; and the third value is less than the second value.

3. The method of claim 1, wherein:

the first parameter is a voltage applied to the memory cell;

during the first progression, the voltage decreases in value after respective ones of the first erase pulses, wherein the second value is less than the first value;

during the second progression, the voltage decreases in value after respective ones of the second erase pulses; and the third value is greater than the second value.

4. The method of claim 1, wherein:

the first parameter is a duration of respective ones of the first and second erase pulses;

during the first progression, the duration increases in value after respective ones of the first erase pulses, wherein the second value is greater than the first value;

during the second progression, the duration increases in value after respective ones of the second erase pulses; and the third value is less than the second value.

5. The method of claim 1, wherein:

during the first progression, the first parameter changes in value by a first change value after respective ones of the first erase pulses;

during the second progression, the first parameter changes in value by a second change value after respective ones of the second erase pulses; and the second change value is equal to the first change value.

6. The method of claim 1, wherein:

during the first progression, the first parameter changes in value by a first change value after respective ones of the first erase pulses;

during the second progression, the first parameter changes in value by a second change value after respective ones of the second erase pulses; and the second change value is less than the first change value.

7. The method of claim 2, wherein the memory cell comprises:

a source region and a drain region formed in a semiconductor substrate, with a channel region of the semiconductor substrate extending between the source region and the drain region;

a floating gate disposed over and insulated from a first portion of the channel region; and a select gate disposed over and insulated from a second portion of the channel region, wherein the voltage applied to the memory cell is applied to the select gate.

8. The method of claim 2, wherein the memory cell comprises:

a source region and a drain region formed in a semiconductor substrate, with a channel region of the semiconductor substrate extending between the source region and the drain region;

a floating gate disposed over and insulated from a first portion of the channel region;

a select gate disposed over and insulated from a second portion of the channel region; and an erase gate disposed over and insulated from the source region, wherein the voltage applied to the memory cell is applied to the erase gate.

9. The method of claim 2, wherein the memory cell comprises:

a source region and a drain region formed in a semiconductor substrate, with a channel region of the semiconductor substrate extending between the source region and the drain region;

a floating gate disposed over and insulated from a first portion of the channel region;

a select gate disposed over and insulated from a second portion of the channel region;

an erase gate disposed over and insulated from the source region; and a control gate disposed over and insulated from the floating gate, wherein the voltage applied to the memory cell is applied to the erase gate.

10. The method of claim 3, wherein the memory cell comprises:

a source region and a drain region formed in a semiconductor substrate, with a channel region of the semiconductor substrate extending between the source region and the drain region;

a floating gate disposed over and insulated from a first portion of the channel region;

a select gate disposed over and insulated from a second portion of the channel region;

an erase gate disposed over and insulated from the source region; and a control gate disposed over and insulated from the floating gate, wherein the voltage applied to the memory cell is applied to the control gate.

11. A semiconductor device, comprising:

a memory cell including a floating gate; and a control circuitry to:

apply successive first erase pulses to the memory cell to remove electrons from the floating gate until a coarse target read current for the memory cell is achieved, wherein the first erase pulses include a first parameter following a first progression in which the first parameter changes in value after respective ones of the first erase pulses and wherein the first progression begins with a first value of the first parameter and ends with a second value of the first parameter; and after the coarse target read current is achieved, apply successive second erase pulses to the memory cell to remove electrons from the floating gate until a target read current for the memory cell is achieved, wherein the second erase pulses include the first parameter following a second progression in which the first parameter changes in value after respective ones of the second erase pulses, wherein the second progression begins with a third value of the first parameter that is between, and unequal to, the first and second values.

12. The semiconductor device of claim 11, wherein:

the first parameter is a voltage applied to the memory cell;

during the first progression, the voltage increases in value after respective ones of the first erase pulses, wherein the second value is greater than the first value;

during the second progression, the voltage increases in value after respective ones of the second erase pulses; and the third value is less than the second value.

13. The semiconductor device of claim 11, wherein:

the first parameter is a voltage applied to the memory cell;

during the first progression, the voltage decreases in value after respective ones of the first erase pulses, wherein the second value is less than the first value;

during the second progression, the voltage decreases in value after respective ones of the second erase pulses; and the third value is greater than the second value.

14. The semiconductor device of claim 11, wherein:

the first parameter is a duration of respective ones of the first and second erase pulses;

during the first progression, the duration increases in value after respective ones of the first erase pulses, wherein the second value is greater than the first value;

during the second progression, the duration increases in value after respective ones of the second erase pulses; and the third value is less than the second value.

15. The semiconductor device of claim 11, wherein:

during the first progression, the first parameter changes in value by a first change value after respective ones of the first erase pulses;

during the second progression, the first parameter changes in value by a second change value after respective ones of the second erase pulses; and the second change value is equal to the first change value.

16. The semiconductor device of claim 11, wherein:

during the first progression, the first parameter changes in value by a first change value after respective ones of the first erase pulses;

during the second progression, the first parameter changes in value by a second change value after respective ones of the second erase pulses; and the second change value is less than the first change value.

17. The semiconductor device of claim 12, wherein the memory cell comprises:

a source region and a drain region formed in a semiconductor substrate, with a channel region of the semiconductor substrate extending between the source region and the drain region;

a floating gate disposed over and insulated from a first portion of the channel region; and a select gate disposed over and insulated from a second portion of the channel region, wherein the voltage applied to the memory cell is applied to the select gate.

18. The semiconductor device of claim 12, wherein the memory cell comprises:

a source region and a drain region formed in a semiconductor substrate, with a channel region of the semiconductor substrate extending between the source region and the drain region;

a floating gate disposed over and insulated from a first portion of the channel region;

a select gate disposed over and insulated from a second portion of the channel region; and an erase gate disposed over and insulated from the source region, wherein the voltage applied to the memory cell is applied to the erase gate.

19. The semiconductor device of claim 12, wherein the memory cell comprises:

a source region and a drain region formed in a semiconductor substrate, with a channel region of the semiconductor substrate extending between the source region and the drain region;

a floating gate disposed over and insulated from a first portion of the channel region;

a select gate disposed over and insulated from a second portion of the channel region;

an erase gate disposed over and insulated from the source region; and a control gate disposed over and insulated from the floating gate, wherein the voltage applied to the memory cell is applied to the erase gate.

20. The semiconductor device of claim 13, wherein the memory cell comprises:

a source region and a drain region formed in a semiconductor substrate, with a channel region of the semiconductor substrate extending between the source region and the drain region;

a floating gate disposed over and insulated from a first portion of the channel region;

a select gate disposed over and insulated from a second portion of the channel region;

an erase gate disposed over and insulated from the source region; and a control gate disposed over and insulated from the floating gate, wherein the voltage applied to the memory cell is applied to the control gate.

* * * * *